United States Patent
Said

(10) Patent No.: US 6,960,119 B1
(45) Date of Patent: Nov. 1, 2005

(54) METHOD AND SYSTEM FOR DEFLASHING MOLD COMPOUND

(75) Inventor: Mohd Hanafi Mohd Said, Selangor (MY)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/845,559

(22) Filed: May 13, 2004

(51) Int. Cl.$^7$ .................................................. B24B 1/00
(52) U.S. Cl. .................................... 451/39; 451/80
(58) Field of Search ........................ 451/36, 38, 39, 451/91, 99, 75, 80, 81; 134/1.3, 2, 32

(56) References Cited

U.S. PATENT DOCUMENTS

| | | | |
|---|---|---|---|
| 5,766,368 A * | 6/1998 | Bowers .......................... | 134/6 |
| 5,865,901 A * | 2/1999 | Yin et al. ........................ | 134/2 |
| 5,928,434 A * | 7/1999 | Goenka .......................... | 134/2 |
| 6,004,400 A * | 12/1999 | Bishop et al. .................. | 134/2 |
| 6,066,032 A * | 5/2000 | Borden et al. ................. | 451/80 |

* cited by examiner

Primary Examiner—Dung Van Nguyen
(74) Attorney, Agent, or Firm—Yingsheng Tung; Wade James Brady, III; Frederick J. Telecky, Jr.

(57) ABSTRACT

A method and system for deflashing mold compound is provided. In one embodiment, a method for dislodging contaminants from an integrated circuit includes directing sublimating particles against a surface of the integrated circuit. Contaminants disposed on the surface of the integrated circuit are abraded with the sublimating particles to dislodge at least a portion of the contaminants.

20 Claims, 4 Drawing Sheets

METHOD AND SYSTEM FOR DEFLASHING MOLD COMPOUND

TECHNICAL FIELD

This invention relates generally to integrated circuit device, and more particularly to a method system for deflashing mold compound.

BACKGROUND

Semiconductor devices are used in a wide variety of applications. The requirement for cheaper and smaller products initiated the development of new semiconductor packaging technology. A popular form of semiconductor packaging technology includes attaching semiconductor devices to a metal frame called a leadframe. Semiconductor devices are attached to the center of the leadframe and are often encapsulated in a material such as an epoxy molding compound. The encapsulation of the semiconductor devices protects the delicate electrical devices from outside elements. In addition, semiconductor encapsulation results in more robust components having an acceptable level of reliability, particularly for consumer applications. However, conventional methods of encapsulation suffer from problems such as the formation of flash on the leadframe. Flash can impair the physical and/or electrical connections between leadframes and printed circuit boards, which negatively impacts the reliability of the encapsulated components.

Conventional deflashing processes typically use chemicals, water, or hard solids immersed in water as agents for mold flash removal. In the case of chemical treatment, strong acid or alkaline chemicals are used to attack the interface between the mold flash or resin and the leadframe surface, which creates waste and/or recycling issues. After sufficient chemical activity, a water rinse and water jet may be used to detach the mold flash or resin from the leadframe or substrate surface. In the case of abrasive blasting treatment, glass or crystal beads mixed with water may also be used to blast the mold flash's or resin's top surface that is in contact with the blasting agent; however, this process results in pits or dents in leadframe surfaces and/or leadframe warping.

SUMMARY OF THE INVENTION

A method and system for deflashing mold compound is provided. In one embodiment, a method for dislodging contaminants from an integrated circuit includes directing sublimating particles against a surface of the integrated circuit. Contaminants disposed on the surface of the integrated circuit are abraded with the sublimating particles to dislodge at least a portion of the contaminants.

One or more embodiments of the present invention may include some, none, or all of the following technical advantages. For example, some embodiments may utilize dry ice to cause contaminant with a coefficients of thermal expansion different than the leadframe to lose adhesion from leadframe. Other technical advantages of one embodiment of the present invention may include reducing, minimizing, or eliminating waste treatment or recycle issues due to the absence of strong acid or alkaline chemicals and pits or dents in leadframe surfaces and/or leadframe warping as a result of the relative softness of the abrading agent. Another technical advantage of one or more embodiments of the present invention includes the provision of a more effective process than conventional water jet method without some or all of the disadvantages of other prior art techniques. Still another technical advantage of one or more embodiments of the present invention may include effective deflashing for moisture or chemical sensitive packages which may not be deflashed using water-based agents or strong acid or alkaline chemicals.

Certain embodiments may provide one or more other technical advantages, one or more of which may be readily apparent to those skilled in the art from the figures, description, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

Embodiments of the present invention and its advantages are best understood by referring to FIGS. 1 through 4 of the drawings, like numerals being used for like and corresponding parts of the various drawings.

The semiconductor manufacturing process is divided into two main processes:

(1) wafer fabrication and (2) wafer testing, assembly, and packaging. The process of wafer fabrication is a series of steps that build successive layers of materials in and on a blank silicon wafer to form a semiconductor device, such as an integrated circuit. Examples of these steps include oxidation, photolithography, deposition, metallization and chemical mechanical planarization, among others. These wafer fabrication steps are well known in the art and are not described in further detail.

Figure 1A:
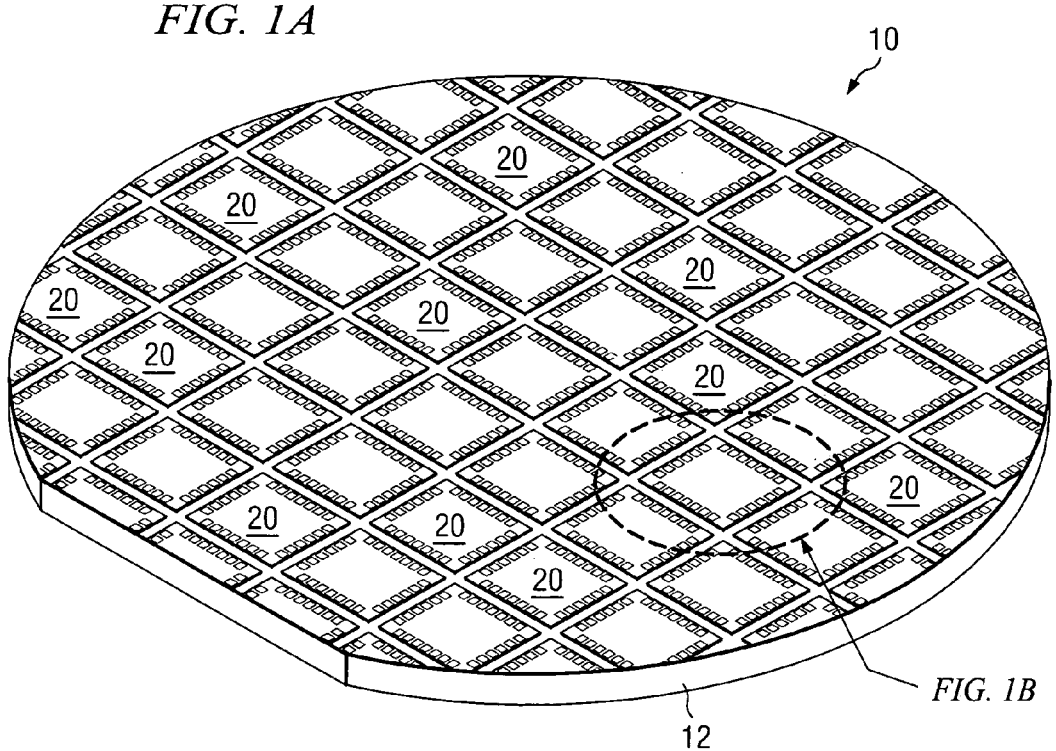
FIG. 1A illustrates a fabricated semiconductor wafer.
Figure 1B:
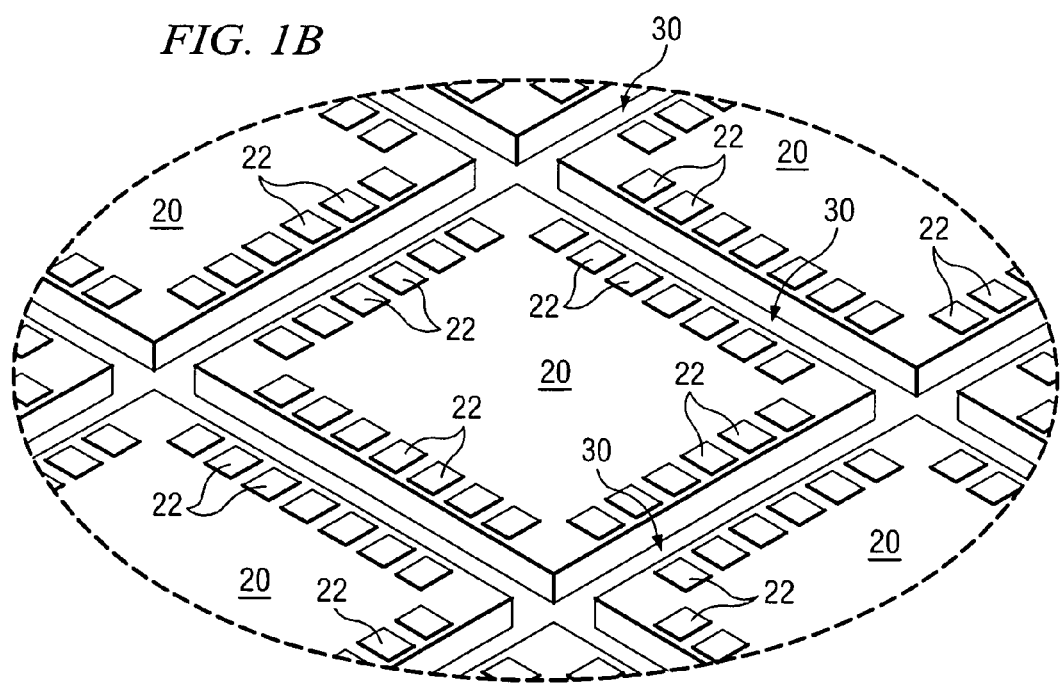
FIG. 1B illustrates an enlarged portion of the wafer of FIG. 1A.

FIGS. 1A and 1B illustrate the product that typically results from wafer fabrication. This product is a fabricated wafer 10 comprising a grid of die 20 formed in and on a blank semiconductor wafer 12. Each die 20 comprises an individual semiconductor device (e.g., an integrated circuit) that was formed during the fabrication stage. Fabricated wafer 10 may contain any number of die 20, depending on their complexity and size. Each die 20 includes a number of bond pads or bonding pads 22 that line the edges of die 20. Bond pads 22 are conductive areas coupled to various parts of the integrated circuit such that electrical signals may be supplied to the circuit. Bond pads 22 may be made from any suitable conductive material, such as metal, may have any suitable size and shape, and may be formed on die 20 in any suitable pattern. Die 20 are separated on fabricated wafer 10 by scribe channels 30 (alternatively called scribe lines or saw lines). Scribe channels 30 comprise the area between the periphery of each die 20 (the portions of blank wafer 12 on which circuits or other structures have not been fabricated).

After wafer 10 has been fabricated, wafer 10 is functionally tested during which time each die 20 may be marked as accepted or rejected depending upon the results of the testing. Wafer testing is well known in the art and is not described in further detail. Wafers 10 arriving from the testing stage typically either have the reject die marked with ink dots or are accompanied by a map of the locations of any defects in the die which may have caused the die to be rejected. The first step in the assembly stage is to separate the die 20 by using a precision saw to cut down scribe channels 30 (alternatively, the die may be separated by scribing). The die 20 that were marked as rejects are discarded, and the die 20 that passed the testing stage are each attached to a frame for packaging (typically referred to as a leadframe), as described in more detail with respect to FIGS. 2A and 2B.

Figure 2A:
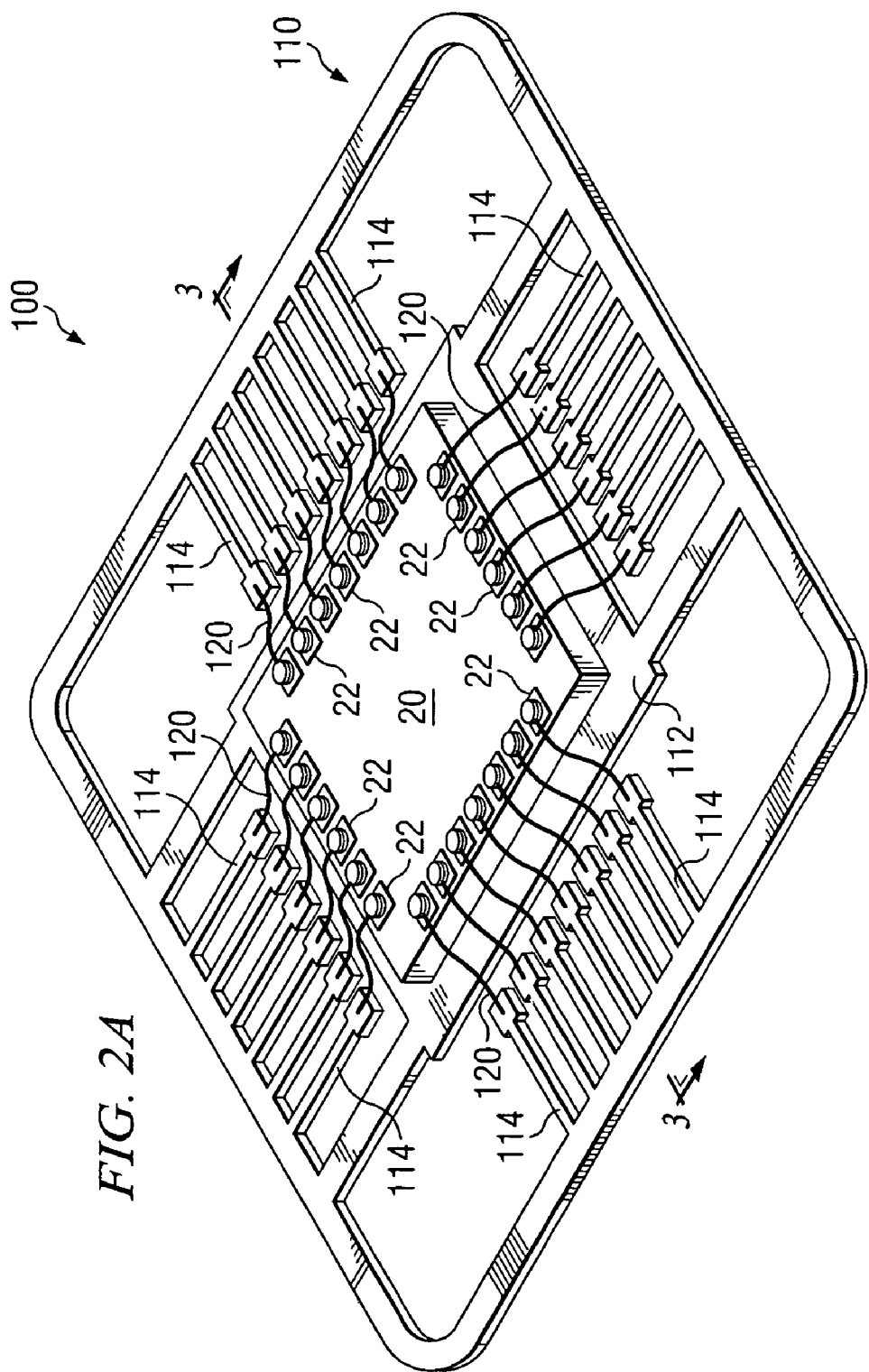
FIG. 2A illustrates an example leadframe assembly
Figure 2B:
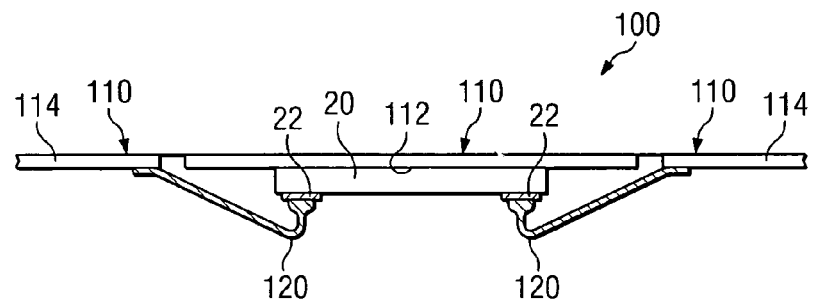
FIG. 2B illustrates a cross section of leadframe assembly of FIG. 2A.
Figure 2C:
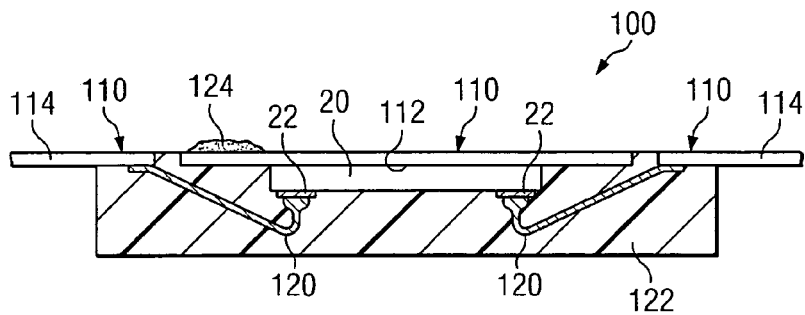
FIG. 2C illustrates a cross section of encapsulated leadframe assembly of FIG. 2A.

FIG. 2A illustrates an example an integrated circuit (IC), which in certain embodiments is a leadframe assembly 100. A cross section of leadframe assembly 100 is illustrated in FIG. 2B. Leadframe assembly 100 includes a leadframe 110, a die 20 attached to leadframe 110, and wires 120 electrically coupling die 20 to leadframe 110. A leadframe, such as leadframe 110, may be made from any appropriate conductive material, such as metal, conductive plastic, or others. In certain embodiments, leadframe 110 may include a die attachment area 112. During packaging, die 20 is attached to die attachment area 112 using a gold-silicon eutectic layer, an epoxy adhesive material, or any other appropriate method of attaching die 20 to die attachment area 112. Once die 20 is attached to die attachment area 112, an automatic wire bonding tool may be used to attach wires 120 to bond pads 22 and leads 114, such that die 20 is electrically coupled to leads 114. In certain embodiments, wires 120 may be made from any suitable conductive material, such as aluminum or gold, and have a diameter less than the diameter of a human hair. For example, wires 120 may have a diameter of approximately 25 micrometers ($\mu$m). After the appropriate electrical connections have been made between die 20 and leadframe 110, a portion of leadframe assembly 100 may be encapsulated in a plastic or epoxy such as, for example, mold 122 illustrated in FIG. 2B.

In one embodiment, to accomplish encapsulation of leadframe assembly 100 in mold 122, leadframe assembly 100 is mounted between a top and bottom mold die in a transfer molding machine where the leadframe 110, in one embodiment, is covered with tape. In this embodiment, the tape reduces, eliminates, or minimizes flash forming on leadframe 110. The dies may be charged with pellets of a molding compound, for example epoxy resin to form mold 122 around leadframe assembly 100. Epoxy resin may include one or more of the following: fused silica, inorganic fillers, catalyst, flame retardants, stress modifiers, adhesion promoters, and other suitable components. Even in light of the tape applied to leadframe 110, a contaminant 124 (illustrated in FIG. 2C) may form on leadframe 110. Contaminant 124 may comprise resin burrs, flash, smear, wax residue, or any other contaminant. Areas of contaminant 124 are undesirable because contaminant 124 may interfere with the connection of LEADFRAME ASSEMBLY 100 with a printed circuit board. For example, contaminant 124 may interfere with an electrical connection between leadframe 100 and a printed circuit board. Accordingly, contaminant 124 may be substantially dislodged from leadframe 110 by the system illustrated in FIG. 3.

Figure 3:
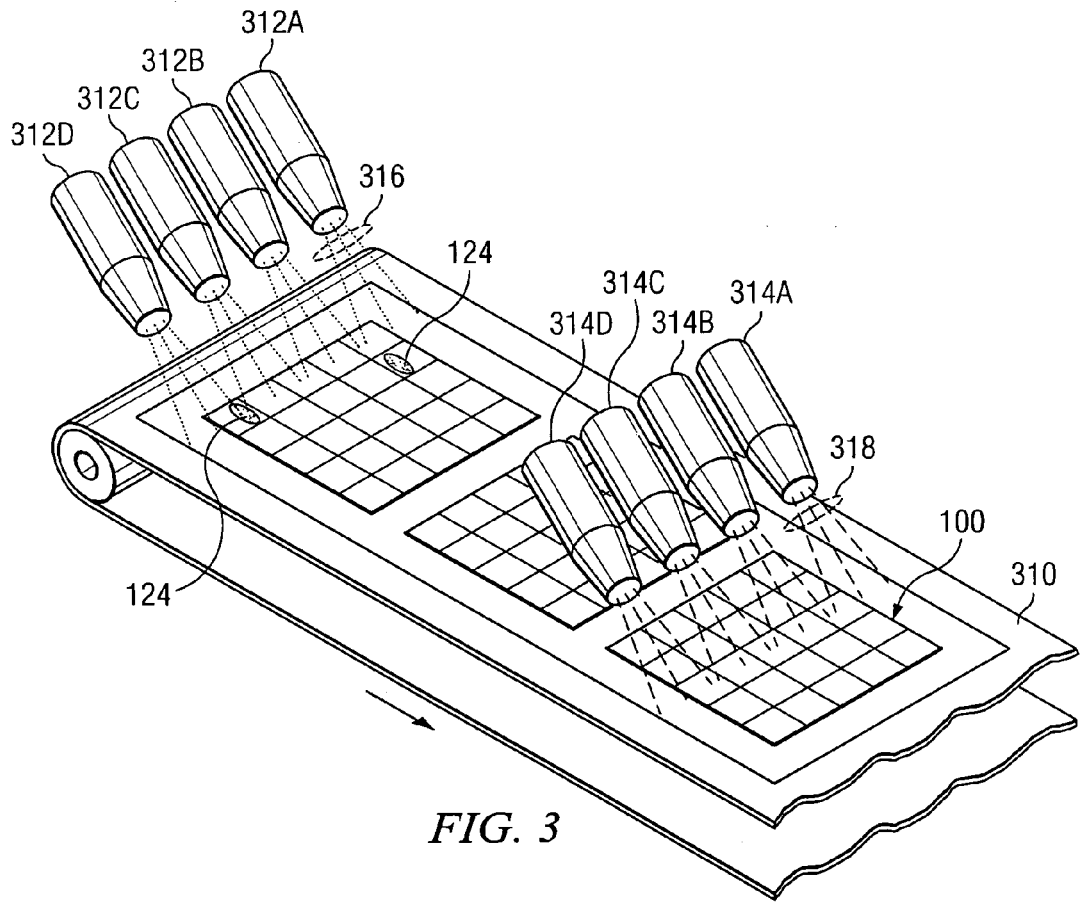
FIG. 3 illustrates one embodiment of a deflashing system according to one embodiment of the present invention.

FIG. 3 illustrates one embodiment of a deflashing system 300 for dislodging contaminants 124 from leadframes 110 and/or other portions of LEADFRAME ASSEMBLY 100. It will be understood that deflashing system 300 may be used to dislodge contaminants other than flash such as, for example, resin burrs, smear, and other contaminants, and the term "deflashing," as used herein, refers to the removal of any such contaminants. Referring to FIG. 3, deflashing system 300 includes conveyor 310, deflashing nozzle 312, and rinse nozzles 314. At a high level, conveyor 310 moves leadframe assemblies 100 relative to deflashing nozzles 312 such that sublimating particles 316 directed by deflashing nozzle 312 abrasively dislodge contaminants 124 from leadframes 110. After dislodgment, rinse nozzles 314 rinse away at least a portion of the dislodged contaminants 124. During the abrasion process, leadframe assemblies 100 are oriented such that the bottom of leadframe assemblies 100 as illustrated in FIG. 2A are abraded with sublimating particles 316.

Conveyor 310 moves leadframe assemblies 100 relative to deflashing nozzles 312 and rinse nozzles 314. Conveyor 310 is operable to move leadframe assemblies 100 at any suitable speed. For example, conveyor 310 may move leadframe assemblies 100 relative to deflashing nozzle 312 and rinse nozzles 314 at a speed selected from the range 5 to 8 meters per minute (m/min).

Each deflashing nozzle 312 receives sublimating particles 316 and a propelling fluid and directs sublimating particles 316 against leadframe assemblies 100. The propelling fluid provides force to sublimating particles 316 such that sublimating particles 316 exit deflashing nozzle 312 at a sufficient pressure to abrasively dislodge at least a portion of contaminant 124. In one embodiment, the propelling fluid comprises high pressure air such that sublimating particles 316 exit deflashing nozzle 312 with a pressure of 300 to 500 kilograms per square centimeter ($kg/cm^2$). The propelling fluid may comprise any other suitable fluids that provide sublimating particles 316 sufficient pressure to abrasively dislodge at least a portion of contaminant 124. Moreover, the resulting pressure of sublimating particles 316 may be substantially continuous, intermittent, variable, stepped, ramped, tapered, a combination of the foregoing, or otherwise. The propelling fluid and sublimating particles 316 may be mixed prior to entering deflashing nozzle 312 or, alternatively, in connection with entering deflashing nozzle 312. In the illustrated embodiment, deflashing nozzles 312A–D are arranged in a stationary one dimensional array wherein the mixture of sublimating particles 316 and propelling fluid exit deflashing nozzle 312 in a substantially conical pattern. In another embodiment, deflashing system 300 may include a plurality of deflashing nozzles 312 in a two dimensional or otherwise configured array that provide streams of sublimating particles 316 for dislodging contaminants 124. Alternatively, deflashing system 300 may comprise one or more rastering deflashing nozzles 312 that provides at least one stream of sublimating particles 316 that rasters over at least a portion of at least one leadframe 110. In short, deflashing nozzle 312 directs sublimating particles 316 against leadframes 110.

Sublimating particles 316 exit deflashing nozzle 312 and impact leadframes 110 and contaminants 124. As used herein, sublimating particle means a particle that sublimates from a solid to a gas. It will be understood that when referring to sublimating particle that this disclosure is also referring, where appropriate, to particles that substantially sublimate. For example, sublimating particles 316 may substantially comprise frozen carbon dioxide ($CO_2$). Sublimating particles 316 may comprise other suitable particles such as for example frozen sulfur. Alternatively, leadframes 110 may be abraded by particles comprising non-sublimating frozen particles that are gaseous at normal operating conditions such as, for example, frozen nitrogen. In this alternative, deflashing system 300 operates as described except substituting sublimating particles 316 with non-sublimating frozen particles that are gaseous at normal operating conditions. It will be understood that "sublimating particles" may include, where appropriate, "non-sublimating frozen particles that are gaseous at normal operating conditions."

Sublimating particles 316 may have uniform or varied shapes or, alternatively, may alternate between the foregoing over time. For example, each sublimating particle may comprise one of the following shapes: a bead, a pellet, a rice-shaped pellet, a snow flake, or otherwise shaped particle. Additionally, one or more of sublimating particles 316 may be generated by shaving and/or pulverizing a frozen block. In one embodiment, sublimating particles 316 comprises rice-shaped pellets with a diameter in the range of 0.05 to 0.1 inches and a length in the range of 0.10 to 0.50 inches. The temperature difference between sublimating particles 316 and contaminants 124 may weaken the chemical and/or physical bonds between contaminant 124 and leadframe 110. In addition, the kinetic energy of sublimating particle may dislodge at least a portion of contaminant 124 that may result in dislodged contaminants on leadframe 110.

After abrasion by the sublimating particles, rinse nozzles 314 directs a liquid stream 318 against leadframes 110 for removing at least a portion of the contaminants dislodged by particles 316. In the illustrated embodiment, deflashing system 300 includes a one-dimensional array of rinse nozzles 314A–D that directs a water jet 318 against leadframes 110. In another embodiment, deflashing system 300 may include a plurality of rinse nozzles 314 in a two-dimensional or otherwise configured array that provide liquid streams 318 for dislodging dislodged contaminants from leadframe 110. Alternatively, deflashing system 300 may comprise one or more rastering rinse nozzles 314 that provides at least one liquid stream 318 that rasters over a portion of at least one leadframe 110. The liquid may comprise deionized water. Liquid stream 318 may exit rinse nozzle 314 at any appropriate pressure such as, for example, in the range of 100 to 200 kilograms per square centimeter (kg/cm2). Moreover, the resulting pressure of liquid stream 318 may be substantially continuous, intermittent, variable, stepped, ramped, tapered, a combination of the foregoing, or otherwise.

In one aspect of operation, deflashing nozzles 312 receive a mixture of sublimating particles and propelling fluid. In one embodiment, the mixture includes $CO_2$ beads and high-pressure compressed air. Each deflashing nozzle 312 directs the mixture against an impact spot while conveyor 310 moves leadframe assemblies 100 relative to the impact spot such that sublimating particles 316 are swept across leadframe assemblies 100 and contaminants 124. For example, conveyor 310 may move leadframe assemblies 100 at a relative rate of 5 to 8 meters per minute (m/min). The sublimating particles 316 impact leadframe assemblies 100 and contaminates 124 dislodging at least a portion of the contaminants 124 from leadframe assemblies 100. After at least a portion of the contaminants 124 is dislodged, conveyor 310 moves leadframe assemblies 100 relative to the impact spot of liquid stream 318 directed by rinse nozzles 314, substantially removing the dislodged contaminants.

Figure 4:
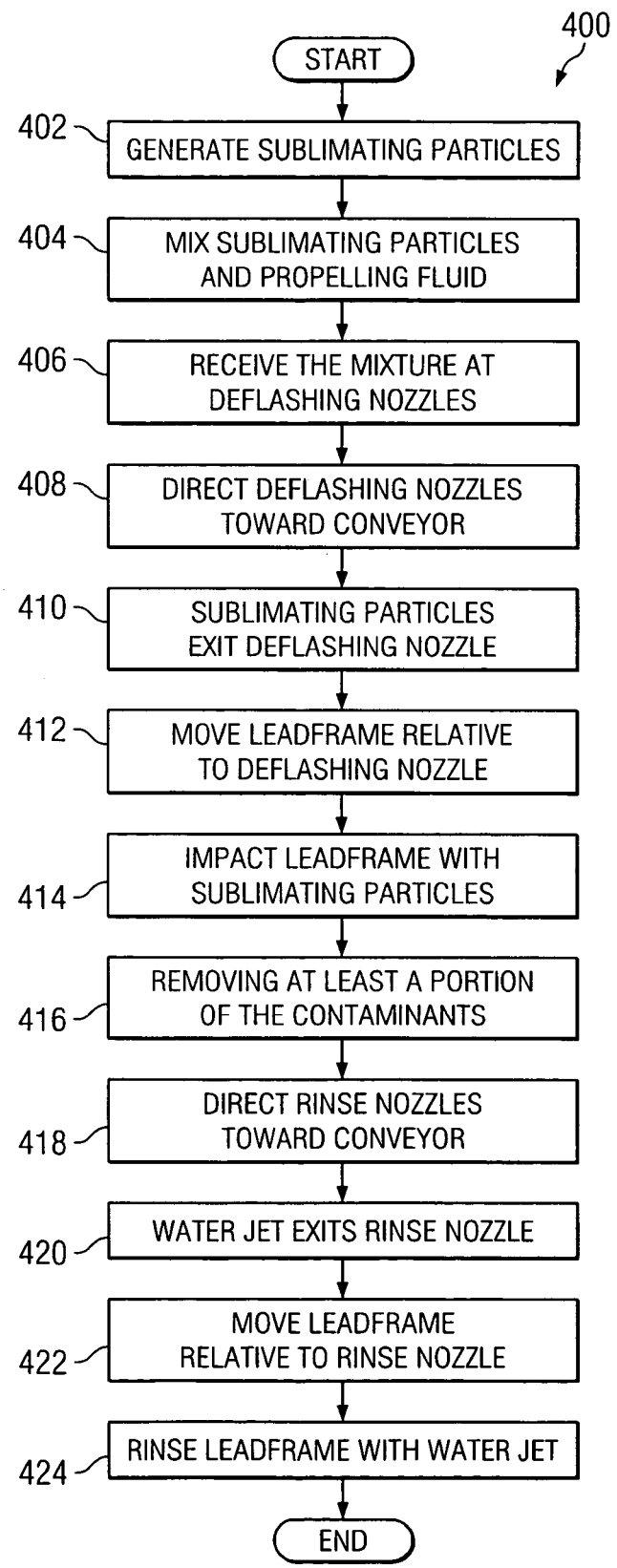
FIG. 4 illustrates an example method for deflashing a leadframe.

FIG. 4 is an exemplary flow diagram illustrating a method 400 for deflashing leadframes 110. Method 400 is described with respect to deflashing system 300 of FIG. 3, but method 400 could also be used by any other system. Moreover, system 300 may use any other suitable technique for performing these tasks. Thus, many of the steps in this flowchart may take place simultaneously and/or in different orders as shown. Moreover, system 300 may use methods with additional steps, fewer steps, and/or different steps, so long as the methods remain appropriate.

At a high level, method 400 illustrates two processes for removing contaminants from a leadframe: an abrasion process and a rinse process. The abrasion process is illustrated in steps 404 to 416, and the rinse process is illustrated in steps 418 to 424. Method 400 begins at step 402 where sublimating particles 316 are generated as discussed in detail above. Next, at step 404, sublimating particles 316 and propelling fluid 318 are mixed. The mixture is received at deflashing nozzles 314 at step 406. At step 408, deflashing nozzles 314 direct the mixture against conveyer 310. Sublimating particles 316 exit deflashing nozzles 314 at step 410. Leadframes 110 are moved relative to deflashing nozzles 312 at step 412. Contaminants 124 on leadframes 110 are impacted with sublimating particles 316 at step 414. At least a portion of contaminant 124 is dislodged at step 416, which may result in dislodged contaminants on leadframes 110.

As mentioned above, steps 418–424 illustrate the rinse process executed by deflashing system 300. At step 418, rinse nozzles 314 direct water jets against conveyor 310. Next, at step 420, water jets 318 exit rinse nozzles 314. Leadframes 110 are moved relative to rinse nozzles 314 at step 422. Next, at step 424, leadframes 110 are rinsed with water jet 318 to remove dislodged contaminants from leadframes 110 and then the method ends.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A method for dislodging contaminants from an integrated circuit, comprising:
   directing sublimating particles against a surface of the integrated circuit;
   abrading with the sublimating particles contaminants disposed on the surface of the integrated circuit to dislodge at least a portion of the contaminants; and
   directing a liquid stream against the surface to remove at least a portion of the dislodged contaminants from the surface.

2. The method of claim 1, wherein the sublimating particles are mixed with high-pressure compressed air prior to being directed against the surface.

3. The method of claim 1, wherein the sublimating particles comprise frozen carbon dioxide.

4. The method of claim 1, wherein the contaminants are created during encapsulation of the integrated circuit.

5. The method of claim 4, wherein the contaminants comprise at least one of flash, resin burr, wax residue, and smear.

6. The method of claim 1, wherein the sublimating particles are directed against the integrated circuit at a pressure ranging from 300 to 500 kilograms per square centimeter.

7. The method of claim 1, wherein the sublimating particles are directed by at least one nozzle, further comprising moving the integrated circuit at a rate of between 5 and 8 meters per minute (m/min) relative to the at least one nozzle.

8. The method of claim 1, wherein the liquid stream comprises a water jet.

9. The method of claim 1, wherein each sublimating particle has a shape selected from the group consisting of a bead, rice-shaped pellet, and a snow flake.

10. The method of claim 1, wherein the sublimating particles having a coefficient of thermal expansion disparate from the contaminant.

11. A system for dislodging contaminants from an integrated circuit, comprising:
   at least one integrated circuit including contaminants on at least a portion of the integrated circuit;
   at least one deflashing nozzle operable to receive sublimating particles and direct the sublimating particles against at least a portion of the contaminants; and
   a rinse nozzle operable to direct a liquid stream against the at least one integrated circuit for removing at least a portion of the dislodged contaminants.

12. The system of claim 11, wherein the deflashing nozzle is operable to receive a mixture of sublimating particles and a propelling fluid and direct the mixture against the integrated circuit for dislodging contaminants from the integrated circuit.

13. The system of claim 11, wherein the sublimating particles comprising frozen carbon dioxide.

14. The system of claim 11, wherein the contaminants are created during encapsulation of the integrated circuit.

15. The system of claim 14, wherein the contaminants comprise at least one of flash, resin burr, wax residue, and smear.

16. The system of claim 11, wherein the deflashing nozzle operable to direct the sublimating particles at a pressure ranging from 300 to 500 kilograms per square centimeter.

17. The system of claim 11, further comprising a conveyor operable to move the at least one integrated circuit with respect to the deflashing nozzle at a rate ranging from range 5 to 8 meters per minute.

18. The system of claim 11, wherein the liquid stream comprises a water jet.

19. The system of claim 11, wherein each sublimating particle has a shape selected from the group consisting of a bead, a rice-shaped pellet, and a snow flake.

20. A system for dislodging contaminants from an integrated circuit, comprising:
   at least one integrated circuit including flash on at least a portion of the integrated circuit;
   a conveyor operable to move the at least one integrated circuit with respect to at least one deflashing nozzle at a rate ranging from range 5 to 8 meters per minute (m/min);
   the at least one deflashing nozzle operable receive a mixture of frozen carbon dioxide beads and high-pressure compressed air and direct the mixture against the leadframe for dislodging the flash from the integrated circuit; and
   at least one rinse nozzle operable to direct a water jet against the at least one integrated circuit for removing at least a portion of the dislodged flash.

* * * * *